(12) United States Patent
Uchida

(10) Patent No.: US 10,434,890 B2
(45) Date of Patent: Oct. 8, 2019

(54) LITHIUM ION SECONDARY BATTERY DIAGNOSIS DEVICE AND LITHIUM ION SECONDARY BATTERY DIAGNOSIS METHOD

(71) Applicant: TOYOTA JIDOSHA KABUSHIKI KAISHA, Toyota-shi, Aichi-ken (JP)

(72) Inventor: Masatoshi Uchida, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 52 days.

(21) Appl. No.: 15/657,278

(22) Filed: Jul. 24, 2017

(65) Prior Publication Data

US 2018/0056809 A1    Mar. 1, 2018

(30) Foreign Application Priority Data

Aug. 25, 2016   (JP) .................................. 2016-164895

(51) Int. Cl.
*G01R 31/389*   (2019.01)
*B60L 11/18*    (2006.01)
(Continued)

(52) U.S. Cl.
CPC ......... B60L 11/1866 (2013.01); B60L 3/0046 (2013.01); B60L 58/22 (2019.02); G01R 31/389 (2019.01); G01R 31/3835 (2019.01); G01R 31/44 (2013.01); H01M 2/1077 (2013.01); H01M 2/34 (2013.01); H01M 10/0525 (2013.01); H01M 10/425 (2013.01);
(Continued)

(58) Field of Classification Search
CPC .................. B60L 11/1866; G01R 31/389
USPC ........................................... 320/136
See application file for complete search history.

(56) References Cited

U.S. PATENT DOCUMENTS 6,924,623 B2 *   8/2005  Nakamura ......... G01R 31/3662
                                                            320/132
7,567,085 B2 *   7/2009  Kim ................. G01R 31/3662
                                                            324/426
(Continued)

FOREIGN PATENT DOCUMENTS

JP          8-47102 A     2/1996
JP       2001-186677 A    7/2001
(Continued)

*Primary Examiner* — Jerry D Robbins
(74) *Attorney, Agent, or Firm* — Sughrue Mion, PLLC

(57) ABSTRACT

A controller performs first control to fourth control whenever the voltage of a cell reaches a specified voltage during discharging. The first control is to stop the discharging. The second control is to close a relay connected, in parallel, to a cell having a voltage having reached the specified voltage. The third control is to measure AC impedance in a state in which relays connected, in parallel, to respective corresponding cells having voltages having reached the specified voltage are all closed. The fourth control is to resume discharging cells having voltages higher than the specified voltage. The controller diagnoses whether the cell having the voltage having reached the specified voltage is abnormal, by comparing (i) AC impedance when the cell having the voltage having reached the specified voltage is included with (ii) AC impedance when the cell having the voltage having reached the specified voltage is excluded.

7 Claims, 13 Drawing Sheets

(51) Int. Cl.
  *G01R 31/3835* (2019.01)
  *B60L 3/00* (2019.01)
  *H01M 10/44* (2006.01)
  *H02J 7/00* (2006.01)
  *G01R 31/44* (2006.01)
  *H01M 2/10* (2006.01)
  *H01M 2/34* (2006.01)
  *H01M 10/0525* (2010.01)
  *H01M 10/42* (2006.01)
  *H01M 10/48* (2006.01)
  *B60L 58/22* (2019.01)
  *B60L 50/60* (2019.01)

(52) U.S. Cl.
  CPC ....... *H01M 10/441* (2013.01); *H01M 10/482* (2013.01); *H02J 7/0029* (2013.01); *H02J 7/0031* (2013.01); *H02J 7/0047* (2013.01); *B60L 50/66* (2019.02); *B60L 2240/545* (2013.01); *B60L 2240/547* (2013.01); *B60L 2240/549* (2013.01); *H01M 2010/4271* (2013.01); *H01M 2220/20* (2013.01); *Y02E 60/122* (2013.01); *Y02T 10/7011* (2013.01)

(56) References Cited

U.S. PATENT DOCUMENTS

| | | | |
|---|---|---|---|
| 9,995,792 B2 * | 6/2018 | Koba | H01M 10/48 |
| 2009/0284226 A1 | 11/2009 | Komori et al. | |
| 2012/0306448 A1 * | 12/2012 | Lu | H02J 7/0016 320/118 |
| 2014/0021923 A1 * | 1/2014 | Uchida | H02J 7/007 320/118 |
| 2015/0234015 A1 * | 8/2015 | Park | G01R 31/3658 702/63 |

FOREIGN PATENT DOCUMENTS

| | | |
|---|---|---|
| JP | 2009-277627 A | 11/2009 |
| JP | 2013-64697 A | 4/2013 |
| JP | 2014-134467 A | 7/2014 |
| JP | 2015-187938 A | 10/2015 |

* cited by examiner

ELECTRODE   ELECTROLYTE
            SOLUTION

FIG.9
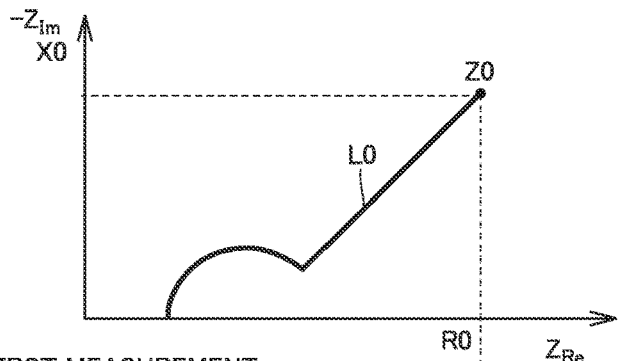
<MEASUREMENT BEFORE STARTING DISCHARGING>
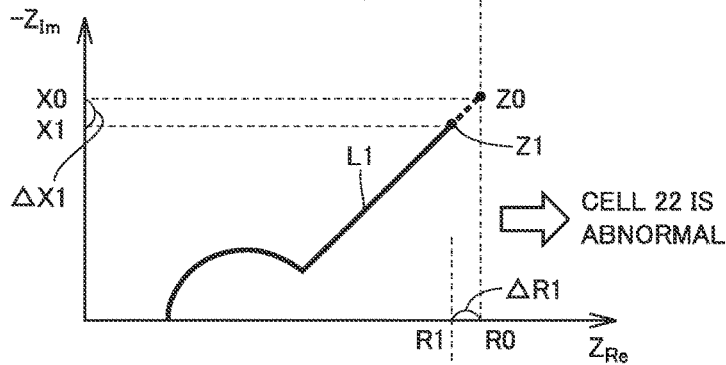
<FIRST MEASUREMENT AFTER STARTING DISCHARGING>
⇒ CELL 22 IS ABNORMAL
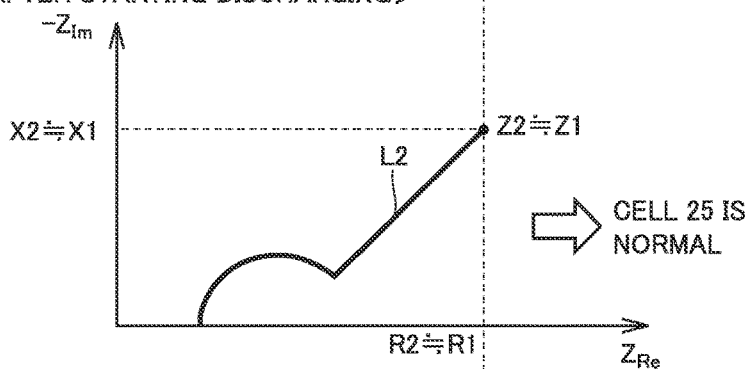
<SECOND MEASUREMENT AFTER STARTING DISCHARGING>
⇒ CELL 25 IS NORMAL
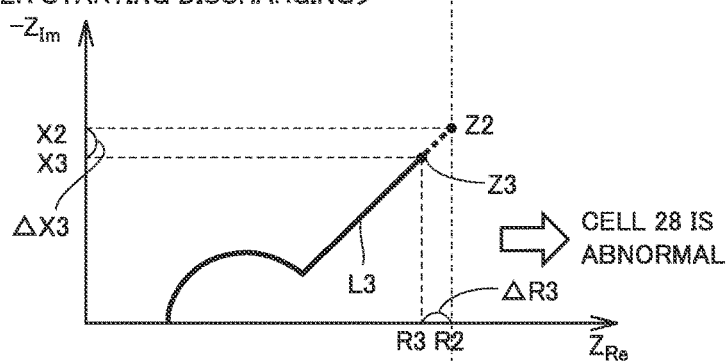
<THIRD MEASUREMENT AFTER STARTING DISCHARGING>
⇒ CELL 28 IS ABNORMAL

LITHIUM ION SECONDARY BATTERY DIAGNOSIS DEVICE AND LITHIUM ION SECONDARY BATTERY DIAGNOSIS METHOD

This nonprovisional application is based on Japanese Patent Application No. 2016-164895 filed on Aug. 25, 2016, with the Japan Patent Office, the entire contents of which are hereby incorporated by reference.

BACKGROUND

Field

The present disclosure relates to a lithium ion secondary battery diagnosis device and a lithium ion secondary battery diagnosis method, more particularly, a technique of diagnosing whether or not there is abnormality in a battery pack including lithium ion secondary batteries by measuring AC impedance.

Description of the Background Art

A battery pack is mounted on an electrically powered vehicle such as a hybrid vehicle. When a period of use of the battery pack exceeds a predetermined period (or when a total traveling distance of the electrically powered vehicle exceeds a predetermined distance), it is desirable to diagnose whether or not there is abnormality in the battery pack as a part of maintenance for the electrically powered vehicle. Moreover, when discharging the electrically powered vehicle, it is desirable to diagnose whether or not there is abnormality in the battery pack in order to find whether or not the battery pack is reusable. For example, Japanese Patent Laying-Open No. 2009-277627 discloses a technique of diagnosing whether or not each of cells included in the battery pack is abnormal based on the discharging voltage of the cell detected when completely discharging the cell.

SUMMARY

As a technique of diagnosing whether or not a lithium ion secondary battery is abnormal, an AC impedance measuring method has been known. Generally, when measuring respective AC impedances of a plurality of cells included in a battery pack, a certain cell is electrically connected to an AC impedance measuring device by an operator's manual operation to measure the AC impedance of the cell. Then, the operator connects the AC impedance measuring device to a different cell (next cell) to measure the AC impedance of the different cell.

Thus, conventionally, in the measurement of the respective AC impedances of the plurality of cells, the AC impedance of each cell is measured individually. Accordingly, the operation of connecting the AC impedance measuring device from one cell to another cell needs to be repeated the same number of times as the number of cells. Since a battery pack mounted on an electrically powered vehicle includes a multiplicity of cells (several ten cells to one hundred and several ten cells, for example), the operation of connecting the AC impedance measuring device from one cell to another cell has been troublesome.

The present disclosure has been made to solve the problem and has an object to provide a technique of reducing troublesomeness upon measuring AC impedance in a lithium ion secondary battery diagnosis device or a lithium ion secondary battery diagnosis method.

A lithium ion secondary battery diagnosis device according to a certain aspect of the present disclosure diagnoses whether or not there is abnormality in a battery pack including lithium ion secondary batteries. The battery pack includes an anode, a cathode, and a plurality of cells connected in series between the anode and the cathode. The lithium ion secondary battery diagnosis device includes: a plurality of relays, a power converter, a measuring instrument, and a controller configured to control the plurality of relays, the power converter, and the measuring instrument. The plurality of relays are each connected to a corresponding one of the plurality of cells in parallel. The power converter is electrically connectable to the anode and the cathode, and is configured to discharge the battery pack. The measuring instrument is electrically connectable to the anode and the cathode, and is configured to measure AC impedance of the battery pack.

The controller is configured to control the power converter to discharge the battery pack. Whenever a voltage of a cell of the plurality of cells reaches a specified voltage during the discharging, the controller is configured to perform first control to fourth control. The first control is to control the power converter to stop discharging the battery pack. The second control is to bypass the cell having the voltage having reached the specified voltage by closing a relay of the plurality of relays, the relay being connected, in parallel, to the cell having the voltage having reached the specified voltage. The third control is to control the measuring instrument to measure the AC impedance of the battery pack in a state in which one or more relays connected, in parallel, to respective corresponding one or more cells having a voltage or voltages having reached the specified voltage are all closed. The fourth control is to control the power converter to resume discharging remaining one or more cells having a voltage or voltages higher than the specified voltage, after measuring the AC impedance. The controller is configured to diagnose whether or not the cell having the voltage having reached the specified voltage is abnormal, by comparing first AC impedance with second AC impedance, the first AC impedance representing AC impedance when the cell having the voltage having reached the specified voltage is included, the second AC impedance representing AC impedance when the cell having the voltage having reached the specified voltage is excluded.

A lithium ion secondary battery diagnosis method according to another aspect of the present disclosure diagnoses whether or not there is abnormality in a battery pack including lithium ion secondary batteries. The battery pack includes an anode, a cathode, and a plurality of cells connected in series between the anode and the cathode. Each of a plurality of relays is connected to a corresponding one of the plurality of cells in parallel.

Whenever a voltage of a cell of the plurality of cells reaches a specified voltage during discharging of the battery pack, the lithium ion secondary battery diagnosis method includes: stopping discharging the battery pack; bypassing the cell having the voltage having reached the specified voltage by closing a relay of the plurality of relays each connected, in parallel, to a corresponding one of the plurality of cells, the relay being connected, in parallel, to the cell having the voltage having reached the specified voltage; measuring AC impedance of the battery pack in a state in which one or more relays connected, in parallel, to respective corresponding one or more cells having a voltage or voltages having reached the specified voltage are all closed; resuming to discharge remaining one or more cells having a voltage or voltages higher than the specified voltage, after the measuring of the AC impedance of the battery pack; and diagnosing whether or not the cell having the voltage having reached the specified voltage is abnormal, by comparing (i)

AC impedance (first AC impedance) when the cell having the voltage having reached the specified voltage is included with (ii) AC impedance (second AC impedance) when the cell having the voltage having reached the specified voltage is excluded.

According to the above-mentioned configuration or method, the AC impedance of the battery pack is measured with the plurality of cells being connected in series. Then, comparison is made between (i) the measurement result (first AC impedance) of the AC impedance when the cell having the voltage having reached the specified voltage is included and (ii) the measurement result (second AC impedance) of the AC impedance when the cell having the voltage having reached the specified voltage is excluded. In this way, whether or not the cell having the voltage having reached the specified voltage is abnormal can be diagnosed (details will be described later), whereby respective AC impedances of the cells do not need to be measured individually. Therefore, the operation of connecting the AC impedance measuring instrument from one cell to another cell does not need to be repeated the same number of times as the number of cells, thereby reducing troublesomeness in AC impedance measurement.

Preferably, when neither of first and second conditions is satisfied, the controller is configured to diagnose that the cell having the voltage having reached the specified voltage is normal. On the other hand, when at least one of the first and second conditions is satisfied, the controller is configured to diagnose that the cell having the voltage having reached the specified voltage is abnormal. The first condition is satisfied when a measurement frequency for AC impedance is lower than a predetermined frequency and a difference between a resistance component of the first AC impedance and a resistance component of the second AC impedance is larger than a first reference value. The second condition is satisfied when the measurement frequency is lower than the predetermined frequency and a difference between a capacitance component of the first AC impedance and a capacitance component of the second AC impedance is larger than a second reference value.

According to the above-mentioned configuration, when at least one of the first and second conditions is satisfied, the cell is diagnosed as being abnormal. In other words, the cell is diagnosed as being abnormal even when it is indicated that only one of the resistance component and the capacitance component of the AC impedance is abnormal. By setting the abnormality diagnosis criteria severely in this way, it is possible to secure high quality of the battery pack diagnosed as being normal in the abnormality diagnosis (for example, the battery pack determined that the battery pack does not need to be replaced).

Preferably, the controller is configured to diagnose that the cell having the voltage having reached the specified voltage is normal, when a difference between a diameter of a semicircle representing the first AC impedance and a diameter of a semicircle representing the second AC impedance is not more than a predetermined reference value in a semicircular locus indicated in a complex impedance plot for AC impedance at a region at which a measurement frequency for AC impedance is higher than a predetermined frequency. On the other hand, the controller is configured to diagnose that the cell having the voltage having reached the specified voltage is abnormal, when the difference is larger than the reference value.

In the complex impedance plot, charge transfer resistance is represented by the diameter of the semicircular locus indicated at the region at which the measurement frequency is higher than the predetermined frequency (details will be described later). Therefore, according to the configuration, abnormality in charge transfer, i.e., abnormality due to decreased performance of an electrode can be diagnosed.

Preferably, the controller is configured to diagnose that the cell having the voltage having reached the specified voltage is normal, when a measurement frequency for AC impedance is higher than a predetermined frequency and a difference between a resistance component of the first AC impedance and a resistance component of the second AC impedance is not more than a predetermined reference value. On the other hand, the controller is configured to diagnose that the cell having the voltage having reached the specified voltage is abnormal, when the difference is larger than the reference value.

Solution resistance of the cell is represented by the resistance component of the AC impedance when the measurement frequency is higher than the predetermined frequency (details will be described later). Therefore, according to the configuration, abnormality in solution resistance, i.e., abnormality due to decreased performance of an electrolyte solution can be diagnosed.

Preferably, the power converter is further configured to charge the battery pack. The controller is configured to control the power converter to further discharge the battery pack after each of voltages of all the cells reaches the specified voltage, and is configured to control the power converter to charge the battery pack after holding the battery pack for a predetermined period in a state in which each of the plurality of cells has a voltage that is at a lower limit voltage lower than the specified voltage.

According to the above-mentioned configuration, the battery pack is held for the predetermined period with the voltage of each cell being at the lower limit voltage, thereby recovering the full charge capacity of the battery pack (recovery process) Moreover, by performing the recovery process consecutively to the AC impedance measurement, time required for discharging can be shortened as compared with a case where the recovery process is performed from a state before the AC impedance measurement (state in which the voltage of each cell is relatively high).

Preferably, the lithium ion secondary battery diagnosis device further includes a jig configured to be attachable/detachable to/from the battery pack. For each of the plurality of cells, the jig includes a first connection portion and a second connection portion, the first connection portion being configured to electrically connect a positive electrode terminal of the cell to one end of a relay connected to the cell in parallel, the second connection portion being configured to electrically connect a negative electrode terminal of the cell to the other end of the relay.

According to the above-mentioned configuration, all the cells and relays can electrically be connected collectively, thereby further reducing the troublesomeness in the operation of connecting from one cell to another cell.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 illustrates the measurement results of the AC impedances in the first embodiment.

DESCRIPTION OF THE PREFERRED EMBODIMENTS

Figure 1:
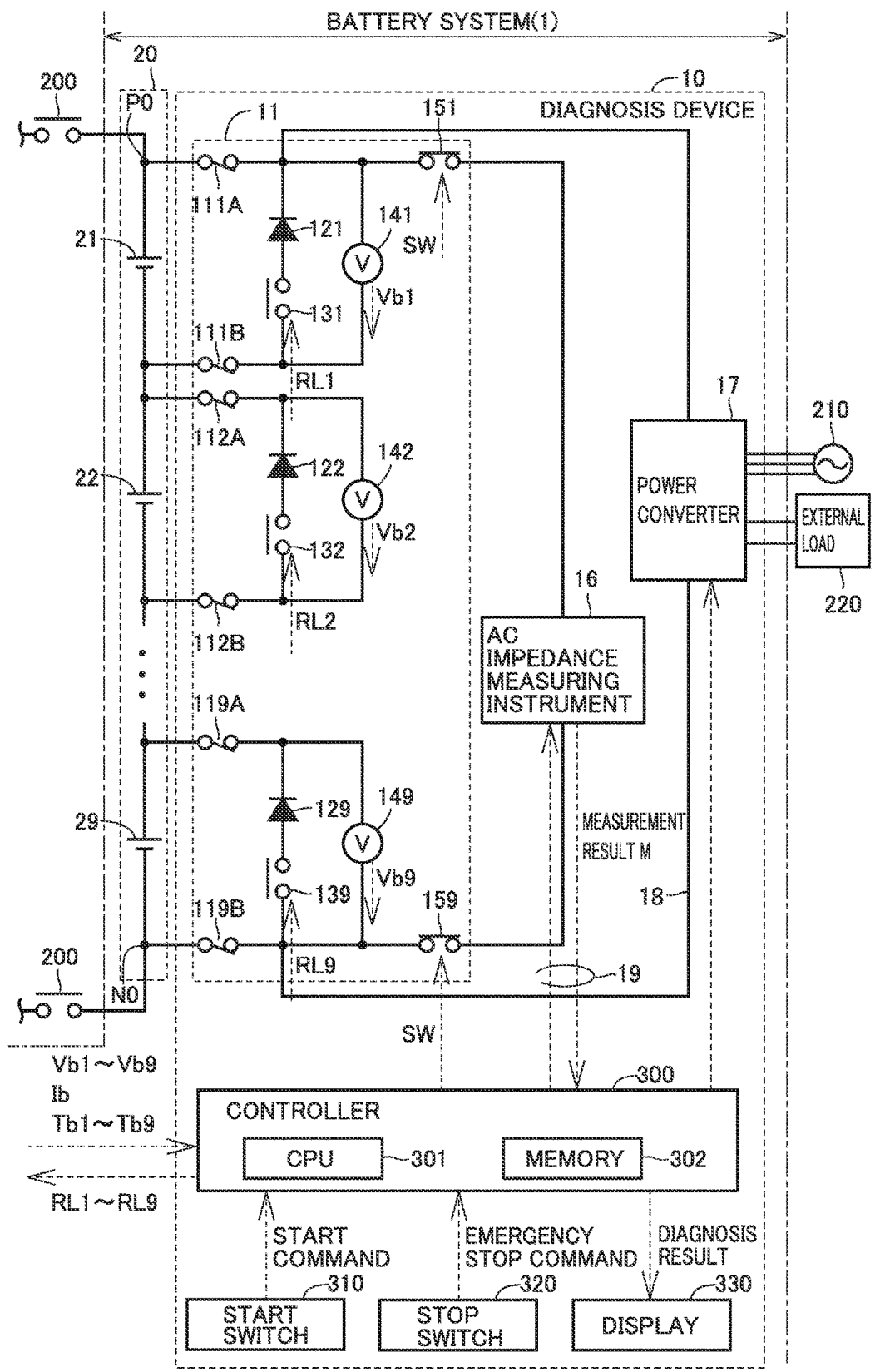
FIG. 1 schematically shows a configuration of a battery system including a lithium ion secondary battery diagnosis device according to a first embodiment.

The following describes embodiments of the present disclosure with reference to figures in detail. It should be noted that the same or corresponding portions in the figures are given the same reference characters and are not described repeatedly.

The following describes an exemplary configuration in which a lithium ion secondary battery diagnosis device according to the present embodiment is mounted on an electrically powered vehicle. The electrically powered vehicle refers to a hybrid vehicle (inclusive of a plug-in hybrid vehicle), an electric vehicle, or a fuel cell vehicle. An operator (such as a dealer's mechanic) diagnoses whether or not there is abnormality in a battery pack using the diagnosis device according to the present embodiment as a part of maintenance for the electrically powered vehicle, for example. It should be noted that the application of the diagnosis device according to the present embodiment is not limited to an in-vehicle battery pack and the diagnosis device may be applied to a stationary battery pack.

[First Embodiment]
<Configuration of Battery System>

FIG. 1 schematically shows a configuration of a battery system including a lithium ion secondary battery diagnosis device according to a first embodiment. A battery system 1 includes a diagnosis device 10 and a battery pack 20. An anode P0 of battery pack 20 is electrically connected to one of two relays included in a system main relay 200 of an electrically powered vehicle (not shown). A cathode N0 of battery pack 20 is electrically connected to the other of the two relays. While diagnosis device 10 is connected to battery pack 20, system main relay 200 is always maintained to be in an open state.

Battery pack 20 includes a plurality of cells 21 to 29 connected in series. Each cell is a lithium ion secondary battery. In the first embodiment, in order to avoid complicated explanation, the following describes an exemplary case where there are nine cells. However, the number of cells is not particularly limited as long as there are a plurality of cells. There may be two to eight cells or may be ten or more cells. Generally, a battery pack mounted on an electrically powered vehicle includes about several ten cells to one hundred and several ten cells.

Diagnosis device 10 includes a connection jig 11. Connection jig 11 is configured to be attachable/detachable to/from battery pack 20 by way of a manual operation of the operator (not shown), for example. Connection jig 11 includes: a plurality of clamps 111A, 111B to 119A, 119B; a plurality of diodes 121 to 129; a plurality of relays 131 to 139; a plurality of voltage sensors 141 to 149; and switches 151, 159. Diagnosis device 10 further includes an AC impedance measuring instrument 16, a power converter 17, a controller 300, a start switch 310, a stop switch 320, and a display 330. Respective circuit configurations provided corresponding to cells 21 to 29 are the same. Therefore, hereinafter, a circuit configuration corresponding to cell 21 will be described representatively.

Each of clamps 111A, 111B is a toggle clamp, for example. Clamp 111A (first connection portion) is connected to a positive electrode terminal side of cell 21, and clamp 111B (second connection portion) is connected to a negative electrode terminal side of cell 21.

Diode 121 and relay 131 are connected in series between clamp 111A and clamp 111B. Diode 121 has a cathode connected to clamp 111A. Diode 121 has an anode connected to one end of relay 131. The other end of relay 131 is connected to clamp 111B. Relay 131 is opened or closed in response to a control signal RL1 from controller 300. When cell 21 is permitted to be discharged, relay 131 is opened. When cell 21 is prohibited to be discharged, relay 131 is closed. It should be noted that relay 131 may be connected to the cathode side of diode 121.

Voltage sensor 141 detects voltage Vb1 of cell 21, and sends a detection result thereof to controller 300. In the description below, voltage Vb1 of cell 21 to voltage Vb9 of cell 29 are also referred to as "voltage Vb" when they are not particularly distinguished from one another. It should be noted that controller 300 obtains, from a current sensor (not shown) provided in battery pack 20, current Ib flowing in battery pack 20. Moreover, controller 300 obtains each of temperatures Tb1 to Tb9 of the cells from a temperature sensor (not shown) provided in battery pack 20.

Switch 151 is electrically connected between clamp 111A and AC impedance measuring instrument 16. Switch 159 is electrically connected between clamp 119B and AC impedance measuring instrument 16. Each of switches 151, 159 is opened or closed in response to a control signal SW from controller 300. Each of switches 151, 159 is closed when measuring the AC impedance of battery pack 20, whereas each of switches 151, 159 is opened when charging and discharging battery pack 20.

AC impedance measuring instrument 16 is configured to measure the AC impedance of battery pack 20. The configuration of AC impedance measuring instrument 16 will be described in detail in FIG. 4.

Power converter 17 is electrically connected between clamp 111A and clamp 119B. Clamp 111A is connected to anode P0 of battery pack 20, and clamp 119B is connected to cathode N0 of battery pack 20. Further, power converter 17 is electrically connected to an external power supply 210 (for example, system power supply) and an external load 220 (device that consumes power). Power converter 17 charges/discharges battery pack 20 in response to a control command from controller 300. For example, power converter 17, which includes an inverter (not shown), converts AC power supplied from external power supply 210 into DC power, thereby charging battery pack 20. Moreover, power converter 17, which includes a converter (not shown), converts the voltage of power stored in battery pack 20 and supplies it to external load 220, thereby discharging battery pack 20. It should be noted that the configurations of external power supply 210 and external load 220 are not particularly limited as long as battery pack 20 can be charged/discharged. For example, each of external power supply 210 and external load 220 may be another battery pack.

Controller 300 is configured to include a CPU (Central Processing Unit) 301, a memory (ROM (Read Only Memory) and RAM (Random Access Memory)) 302, and an input/output buffer (not shown). Based on a signal received from each sensor and map and program stored in memory 302, controller 300 controls each component (specifically, relays 131 to 139, switches 151, 159, AC impedance measuring instrument 16, and power converter 17) in order to bring battery system 1 into a desired state. An exemplary main process performed by controller 300 is diagnosis as to whether or not there is abnormality in battery pack 20 (each of cells 21 to 29). This process will be illustrated in detail in FIG. 7 to FIG. 10.

In response to an operation by the operator, start switch 310 outputs, to controller 300, a command for starting the abnormality diagnosis for battery pack 20. In response to an operation by the operator, stop switch 320 outputs, to controller 300, an emergency command for stopping the abnormality diagnosis for battery pack 20 or for stopping charging/discharging battery pack 20. When the emergency stop signal is received, controller 300 immediately stops the abnormality diagnosis or the charging/discharging of battery pack 20.

Display 330, such as a liquid crystal display, presents a result of the diagnosis performed by controller 300 with regard to abnormality of battery pack 20. The operator checks display 330 to know whether each cell is normal or abnormal.

<Configuration of Connection Jig>

Figure 2:
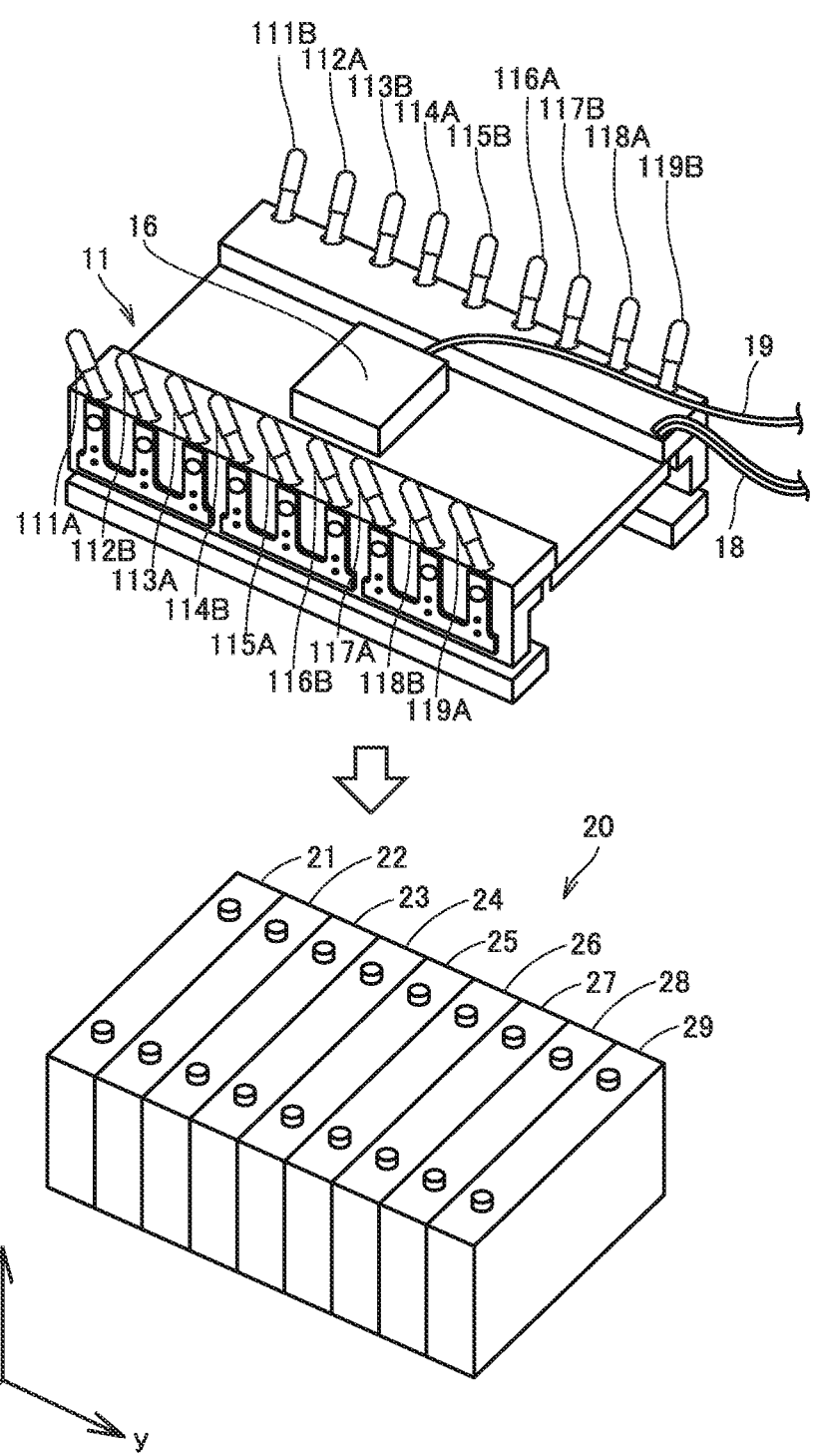
FIG. 2 illustrates a configuration of a connection jig.

FIG. 2 illustrates a configuration of connection jig 11. FIG. 2 shows an exploded perspective view of connection jig 11 and battery pack 20 (a state in which connection jig 11 is detached from battery pack 20). Since each of the plurality of cells 21 to 29 is a prismatic cell, battery pack 20 has a rectangular parallelepiped shape. Connection jig 11 has a shape corresponding to battery pack 20 (substantially rectangular parallelepiped shape with an open bottom) to be attachable to the upper surface of battery pack 20 (the surface thereof in the z direction in the figure). On one side surface of connection jig 11, clamps 111A, 1112B to 118B, 119A are arranged. On the other side surface of connection jig 11, clamps 111B, 112A to 118A, 119B are arranged.

Connection jig 11 is electrically connected to power converter 17 via a power cable 18. Moreover, connection jig 11 is provided with AC impedance measuring instrument 16. AC impedance measuring instrument 16 sends/receives various signals to/from controller 300 via a signal cable 19. Further, connection jig 11 is provided with a substrate (not shown) having diodes 121 to 129, relays 131 to 139, voltage sensors 141 to 149, and switch 151, 159 mounted thereon. It should be noted that AC impedance measuring instrument 16 and the substrate may be provided outside connection jig 11.

Figure 3:
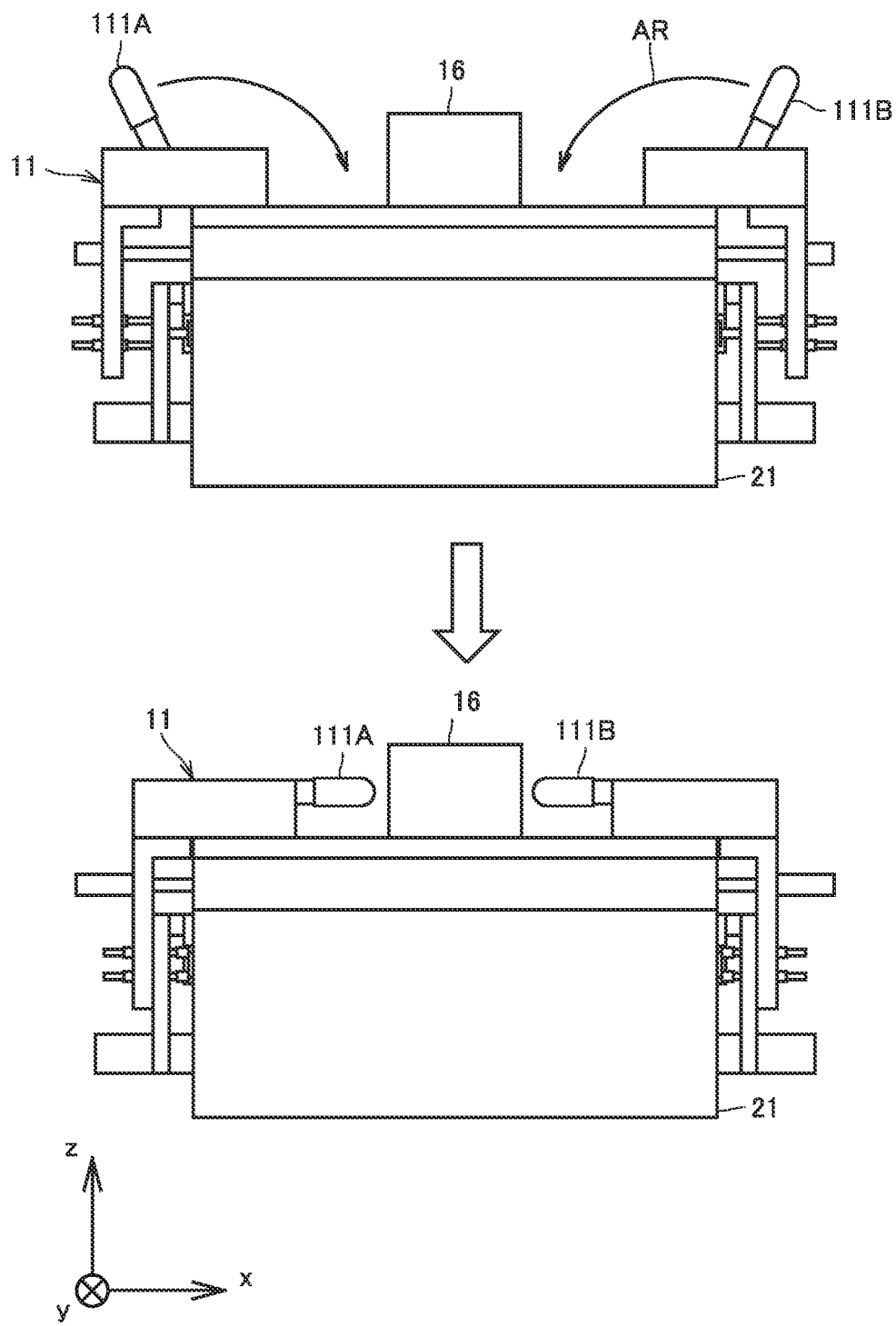
FIG. 3 is a side view of the connection jig when the connection jig is attached to the battery pack.

FIG. 3 is a side view of connection jig 11 in a state in which battery pack 20 is attached to connection jig 11. As shown in FIG. 3, when connection jig 11 is attached to the upper surface of battery pack 20 but clamps 111A, 111B are in a raised state, cell 21 is not electrically connected to diagnosis device 10. When the operator pulls down clamps 111A, 111B (see arrows AR), cell 21 is electrically connected to diagnosis device 10. The same applies to the other clamps (not shown in FIG. 3).

Generally, when measuring respective AC impedances of a plurality of cells, the AC impedance of each cell is measured individually. Specifically, the AC impedance is measured by electrically connecting a certain cell to an AC impedance measuring device by way of a manual operation of the operator using a clip type lead, for example. Then, the operator detaches the clip type lead from the cell, connects the clip type lead to a different cell (next cell), and measures AC impedance of the different cell again. Such a procedure of the operation is repeated until the AC impedances of all the cells are measured. Therefore, the operation of detaching the clip type lead and the operation of attaching the clip type lead need to be performed the same number of times as the number of cells. However, such operations are troublesome because a multiplicity of cells are included particularly in a battery pack mounted on an electrically powered vehicle.

To address this, according to the first embodiment, connection jig 11 is used instead of the clip type lead, thereby electrically connect all the cells 21 to 29 to AC impedance measuring instrument 16 collectively. This can reduce the troublesomeness of the operation of connecting from one cell to another cell. Moreover, during the operation of detaching the clip type lead and the operation of attaching the clip type lead, the clip type lead might be connected to an incorrect cell; however, the use of connection jig 11 prevents such incorrectness during the operations.

It should be noted that the configuration of connection jig 11 is not limited to the configuration shown in each of FIG. 2 and FIG. 3. For example, by coupling clamps 111A, 112B to 118B, 119A on the one side surface to one another, the operator can open/close clamps 111A, 112B to 118B, 119A by one operation. The same applies to clamps 111B, 112A to 118A, 119B on the other side surface. Moreover, it is not essential to open/close each clamp by way of a manual operation of the operator. Each clamp may be switched to be opened/closed in accordance with electric control by controller 300.

<Measurement of AC Impedance>

Figure 4:
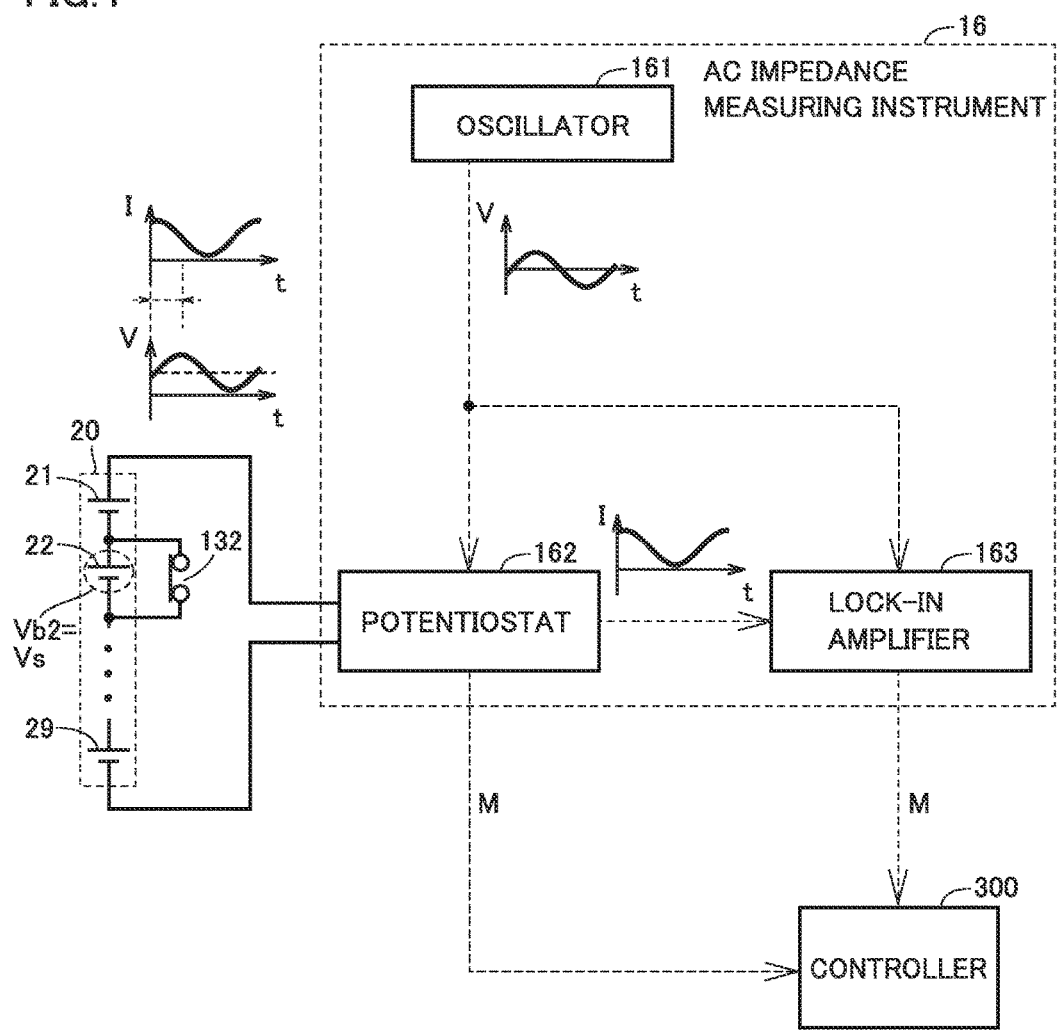
FIG. 4 shows a configuration of an AC impedance measuring instrument more in detail.

FIG. 4 shows the configuration of AC impedance measuring instrument 16 more in detail. AC impedance measuring instrument 16 includes an oscillator 161, a potentiostat 162, and a lock-in amplifier 163.

Oscillator 161 outputs a sinusoidal wave having the same phase to potentiostat 162 and lock-in amplifier 163. Potentiostat 162 superimposes, on a predetermined DC voltage, an AC voltage having the same phase as that of the sinusoidal wave from oscillator 161 (for example, a voltage having an amplitude of about 10 mV), and applies it onto battery pack 20. Moreover, potentiostat 162 detects an AC component of current flowing in battery pack 20, and outputs the detection result to lock-in amplifier 163. Moreover, potentiostat 162 outputs the AC voltage and the AC component of the current to controller 300 as a measurement result M. Lock-in amplifier 163 compares the phase of the sinusoidal wave received from oscillator 161 with the phase of the AC component of the current detected by potentiostat 162, and outputs a phase difference between the sinusoidal wave and the AC component to controller 300 as a measurement result M.

The impedance of battery pack 20 includes various impedance components having different relaxation times (times required to change the system to cause current to flow), such as: a component due to solution resistance; a component due to charge transfer resistance at an electrode/ electrolyte interface (resistance upon insertion/desertion of lithium ions into/from an active material); and a component due to the capacitance of an electrical double layer formed on an electrode surface. For example, when an AC voltage having a high frequency is applied to battery pack 20, a component having a small relaxation time can follow a change of the AC voltage. On the other hand, a component having a large relaxation time cannot follow the change of the AC voltage because a voltage having an opposite polarity is applied before the current flows. Therefore, while gradually changing (sweeping) a frequency f (or angular frequency ω) of the sinusoidal wave output from oscillator 161, the AC voltage applied to battery pack 20 and the AC flowing in battery pack 20 are measured, whereby a dominant impedance component of battery pack 20 at angular frequency ω can be identified.

For each swept angular frequency ω, controller 300 calculates impedance (an amplitude ratio of the AC voltage and the current). Then, controller 300 plots, on a complex plane (illustrated in FIG. 6 below), the result of calculation of the impedance and the phase difference detected by lock-in amplifier 163, it should be noted that the configuration of AC impedance measuring instrument 16 is not limited to the one shown in FIG. 4, and AC impedance measuring instrument 16 may include a frequency response analyzer instead of lock-in amplifier 163, for example.

Figure 5:
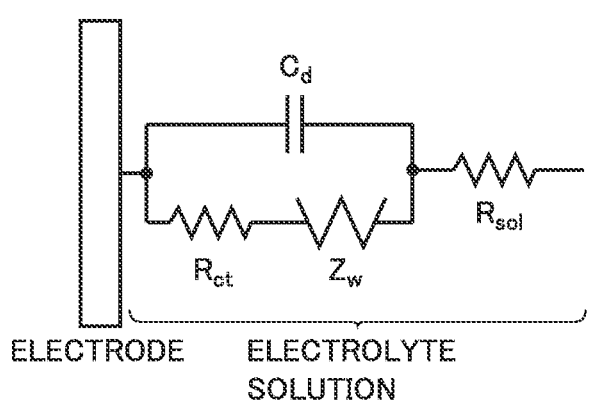
FIG. 5 shows an exemplary equivalent circuit at an electrode interface of the lithium ion secondary battery.

FIG. 5 shows an exemplary equivalent circuit at an electrode interface of the lithium ion secondary battery. In the description below, $R_{sol}$ represents the solution resistance of the electrolyte solution, $R_{ct}$ represents the charge transfer resistance, and $C_d$ represents the capacitance of the electrical double layer of the electrode surface. Moreover, $Z_w$ represents an impedance component (also referred to as "Warburg impedance") associated with a diffusion rate of the electrode reaction.

Figure 6:
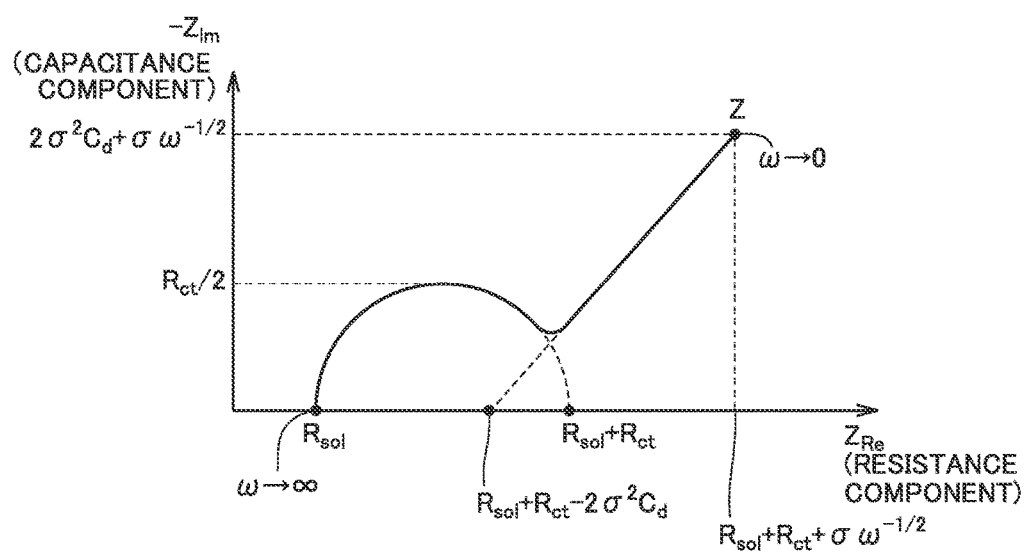
FIG. 6 shows a complex impedance plot of measurement results of AC impedances.

FIG. 6 is a complex impedance plot (also referred to as "Nyquist plot") of the measurement results of the AC impedances. In FIG. 6 as well as FIG. 9, FIG. 11, and FIG. 12 below, the horizontal axis represents a real number component $Z_{Rc}$ (resistance component) of the complex impedance, and the vertical axis represents an imaginary number component $-Z_{Im}$ (capacitance component) of the complex impedance. Angular frequency ω is swept in a range of 10 mHz to 100 kHz, for example.

In a high frequency region of angular frequency ω, a semicircular locus appears. This locus is expressed as in the following formula (1). In other words, solution resistance $R_{sol}$ and charge transfer resistance $R_{ct}$ can be determined from this locus.

$$\left(Z_{Re} - R_{sol} - \frac{R_{ct}}{2}\right)^2 + Z_{Im}^2 = \left(\frac{R_{ct}}{2}\right)^2 \quad (1)$$

On the other hand, since the diffusion rate in the electrode reaction of the lithium ion secondary battery is relatively slow, a linear locus appears in a low frequency region of angular frequency ω. This linear locus is expressed as in the following formula (2). It should be noted that in the formula (2), the following formula (3) is established between σ (constant determined according to the current and the temperature) and Warburg impedance $Z_w$.

$$-Z_{Im} = Z_{Re} - R_{sol} - R_{ct} + 2\sigma^2 C_d \quad (2)$$

$$Z_W = \sigma\omega^{-1/2}(1-j) \quad (3)$$

According to the formulas (2) and (3), it is understood that in a measurement point Z at a sufficiently low angular frequency ω (point at a measurement frequency lower than a predetermined frequency), real number component $Z_{Rc}$ of the complex impedance can be approximated to ($R_{sol}+R_{ct}+\sigma\omega^{-1/2}$) and imaginary number component $-Z_{Im}$ can be approximated to ($2\sigma^2C_d+\sigma\omega^{-1/2}$).

Generally, it has been known that in the lithium ion secondary battery, so-called "high-rate deterioration" is caused by repeated charging or discharging with large current. The high-rate deterioration is caused due to imbalance in distribution (salt concentration distribution) of lithium ions in the electrolyte solution and is associated with diffusion of ions. Hence, the high-rate deterioration is likely to be reflected in a measurement point at a sufficiently low angular frequency ω (for example, Z shown in FIG. 6). Therefore, in the first embodiment, the abnormality diagnosis for battery pack 20 is performed with attention paid to measurement point Z.

<Abnormality Diagnosis for Battery Pack>

Figure 7:
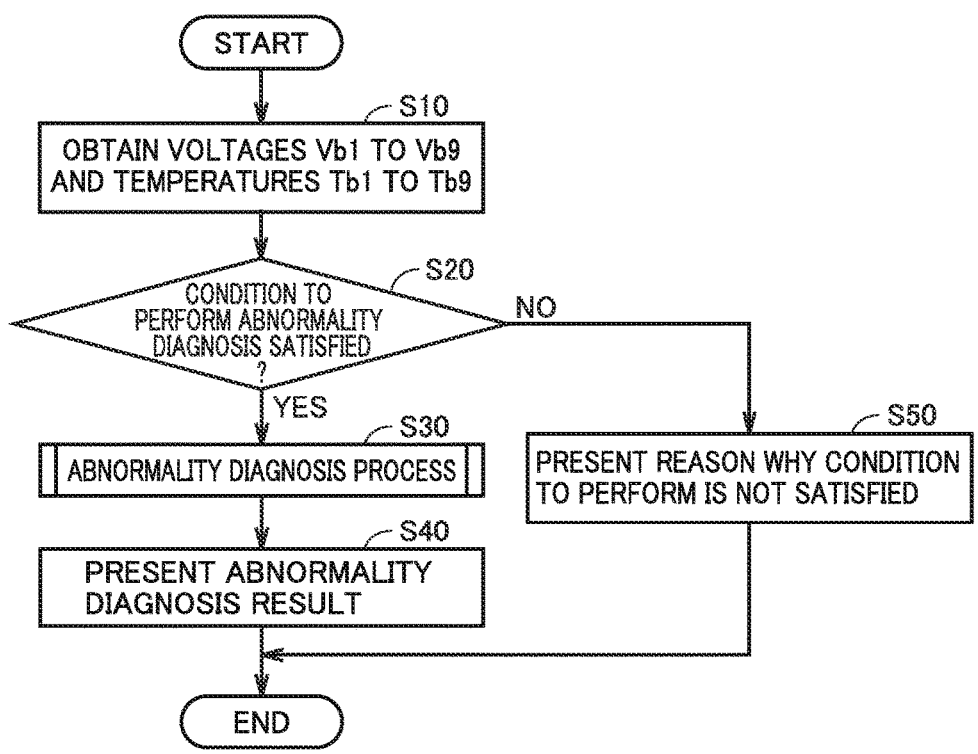
FIG. 7 is a flowchart showing a lithium ion secondary battery diagnosis method in the first embodiment.

FIG. 7 is a flowchart showing a lithium ion secondary battery diagnosing method in the first embodiment. The process of the flowchart shown in each of FIG. 7 and FIG. 13 below is performed by the operator operating start switch 310. It should be noted that each step (hereinafter, abbreviated as "S") included in the flowchart shown in each of FIG. 7, FIG. 10, and FIG. 13 below is basically implemented by a software process by controller 300; however, a part or the whole of the process may be implemented by hardware (electric circuit) fabricated in controller 300.

In S10, controller 300 uses voltage sensors 141 to 149 to obtain voltages Vb1 to Vb9 of cells 21 to 29 and obtain temperatures Tb1 to Tb9 of cells 21 to 29.

In S20, controller 300 determines whether or not a condition is satisfied to permit execution of the abnormality diagnosis for battery pack 20. More specifically, controller 300 determines that the abnormality diagnosis for battery pack 20 can be performed when each of voltages Vb1 to Vb9 of the cells is higher than a specified voltage Vs and variation (for example, a difference between the maximum temperature and the minimum temperature) among temperatures Tb1 to Tb9 of the cells is not more than a predetermined value. When the condition is not satisfied to permit the execution of the abnormality diagnosis for battery pack 20 (NO in S20), controller 300 controls display 330 to present a message indicating a reason why the abnormality diagnosis for battery pack 20 cannot be performed (for example, message indicating that temperature variation is large) (S50), and ends the process.

On the other hand, when the condition is satisfied to permit the execution of the abnormality diagnosis for battery pack 20 (YES in S20), controller 300 proceeds the process to S30, and performs the abnormality diagnosis for battery pack 20. Further, controller 300 controls display 330 to present a diagnosis result indicating that each of cells 21 to 29 is abnormal or not (S40).

Figure 8:
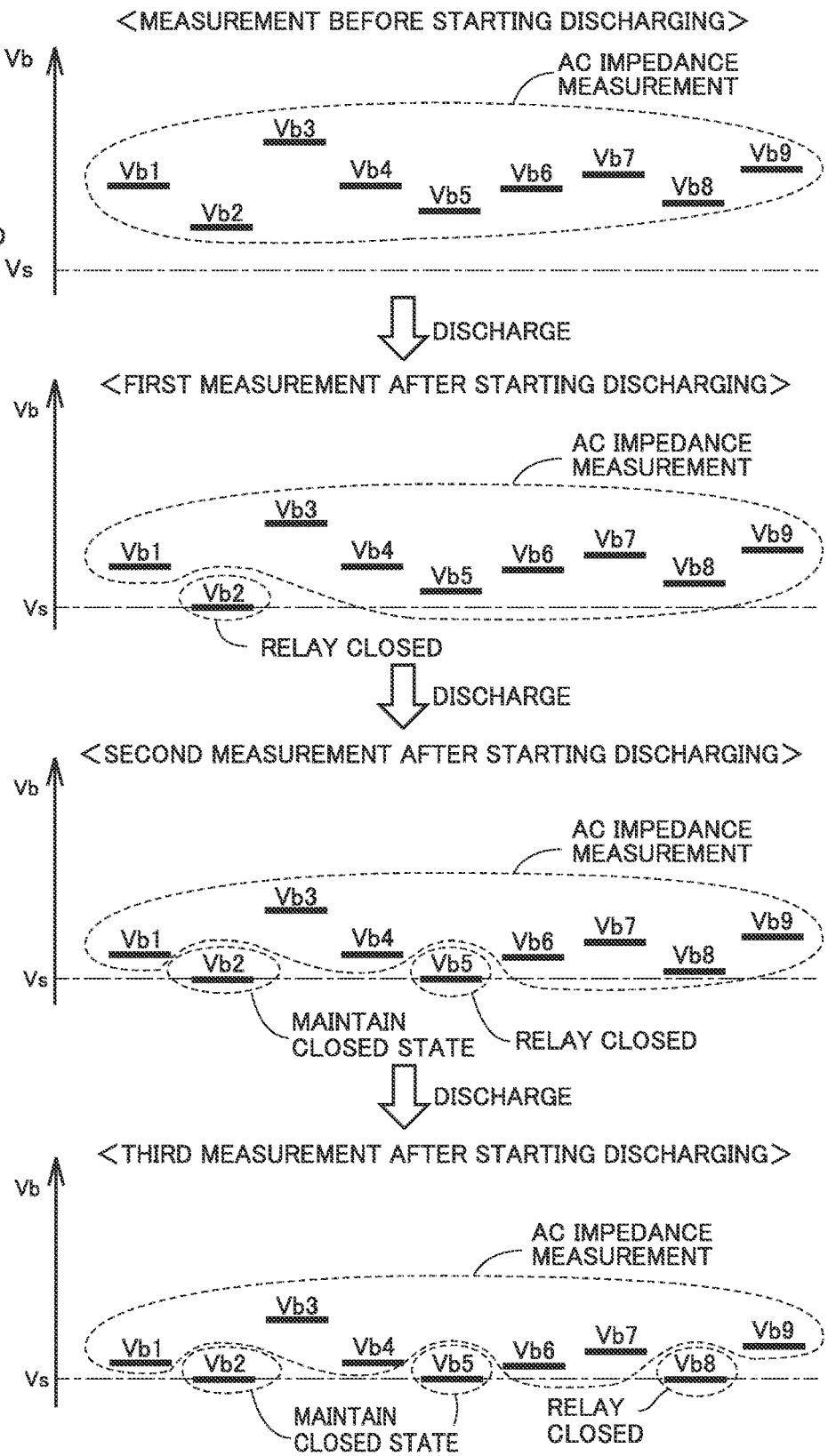
FIG. 8 schematically shows the lithium ion secondary battery diagnosis method in the first embodiment.

FIG. 8 schematically illustrates the lithium ion secondary battery diagnosing method in the first embodiment. In FIG. 8, the vertical axis represents voltage Vb of each cell. In FIG. 8, voltage Vb1 of cell 21 to voltage Vb9 of cell 29 are shown. Although battery pack 20 is provided with an equalization circuit (not shown) for equalizing voltage Vb of each cell, there can be a slight variation among voltages Vb1 to Vb9 (for example, a variation of about several mV to several ten mV). The following describes a case where before the start of discharging, each of voltages Vb1 to Vb9 is higher than predetermined specified voltage Vs and voltages Vb2, Vb5, Vb8 are smaller and closer to specified voltage Vs in this order.

Before starting the discharging, relays 131 to 139 are all open and all the cells 21 to 29 are connected in series. In this state, the AC impedance is measured and a measurement result M(0) is stored in memory 302. It should be noted that when the range of angular frequency ω is set at 10 mHz to 10 kHz and measurement is performed once for each order (i.e., measurement is performed at each of 10 mHz, 0.1 Hz, 1 Hz, 10 Hz, 100 Hz, 1 kHz, and 10 kHz), it takes several minutes to measure the AC impedance.

Next, battery pack 20 starts to be discharged. Voltages Vb1 to Vb9 of the cells are decreased with passage of time. Voltage Vb2 of cell 22 first reaches specified voltage Vs. Accordingly, battery pack 20 is stopped being discharged and relay 132 connected to cell 22 in parallel is closed. Accordingly, cell 22 is bypassed, with the result that cells (cells 21, 23 to 29) other than cell 22 are connected in series. In this state, AC impedance measurement (first measurement after discharging) is performed, and a measurement result M(1) is stored in memory 302 (see FIG. 4).

Then, the discharging of battery pack 20 is resumed with relay 132 being maintained in the closed state. After voltage Vb2 of cell 22, voltage Vb5 of cell 25 reaches specified voltage Vs. Accordingly, battery pack 20 is stopped being discharged and relay 135 connected to cell 25 in parallel is closed. Accordingly, cells 22, 25 are bypassed, with the result that cells (cells 21, 23, 24, 26 to 29) other than cells 22, 25 are connected in series. In this state, AC impedance measurement is performed, and a measurement result M(2) is stored in memory 302.

Further, the discharging of battery pack 20 is resumed with relays 132, 135 being maintained in the closed state. When voltage Vb8 of cell 28 reaches specified voltage Vs, the discharging of battery pack 20 is stopped and relay 138 connected to cell 28 in parallel is closed as with the above-described process. Then, AC impedance measurement is performed with cells (cells 21, 23, 24, 26, 27, 29) other than cells 22, 25, 28 being connected in series, and a measurement result M(3) is stored in memory 302.

The same process is repeated until each of voltages Vb1 to Vb9 of all the cells 21 to 29 reaches specified voltage Vs. In other words, AC impedance is measured in a state in which all the cells other than the cell(s) having voltage(s) having reached specified voltage Vs are connected in series. Further, as described below, the results of two continuous AC impedance measurements are compared to diagnose whether or not each cell is abnormal.

FIG. 9 shows a complex impedance plot for illustrating the AC impedance measurement results in the first embodiment. A curve L0 represents measurement result M(0) before starting the discharging of battery pack 20 (i.e., measurement result when all the cells 21 to 29 are connected in series). A curve L1 represents measurement result M(1) when the cells other than cell are connected in series. A curve L2 represents measurement result M(2) when the cells other than cells 22, 25 are connected in series. A curve L3 represents measurement result M(3) when the cells other than cells 22, 25, 28 are connected in series.

First, a technique of diagnosing whether cell 22 is normal or abnormal will be described. In the diagnosis for cell 22, the measurement result (curve L0) of the AC impedance when cell 22 is included is compared with the measurement result (curve L1) of the AC impedance when cell 22 is excluded. When cell 22 is normal, the impedance of cell 22 is sufficiently low. Therefore, the measurement result (curve L0) when cell 22 is included becomes substantially equal to the measurement result (curve L1) when cell 22 is excluded. On the other hand, when cell 22 is abnormal, the impedance of cell 22 becomes higher than the impedance of each of the other normal cells. Therefore, a certain degree of difference appears between the measurement result (curve L0) when cell 22 is included and the measurement result (curve L1) when cell 22 is excluded.

More specifically, in the first embodiment, a measurement result at measurement frequency ω lower than a predetermined frequency (for example, a measurement result at angular frequency ω=10 mHz) is used. Moreover, in order to compare a measurement point Z0 (R0, X0) on curve L0 with a measurement point Z1 (R1, X1) on curve L1, a difference ΔR1 (=R0−R1) between the resistance components of the impedances and a difference ΔX1 (=X0−X1) between the capacitance components of the impedances are calculated.

Cell 22 is diagnosed as being abnormal when at least one of a first condition and a second condition is satisfied. The first condition is such that difference ΔR1 between the resistance components is larger than a predetermined reference value Rc (first reference value). The second condition is such that difference ΔX1 between the capacitance components is larger than a predetermined reference value Xc (second reference value). On the other hand, cell 22 is diagnosed as being normal when neither of the first and second conditions is satisfied, i.e., when difference ΔR1 between the resistance components is not more than reference value Rc and difference ΔX1 between the capacitance components is not more than reference value Xc. In the example shown in FIG. 9, since difference ΔR1 is larger than reference value Rc and difference ΔX1 is larger than reference value Xc, cell 22 is diagnosed as being abnormal.

Next, in order to diagnose whether cell 25 is normal or abnormal, curve L1 is compared with curve L2. In the example shown in FIG. 9, a resistance component R2 of the impedance when cell 25 is excluded is substantially equal to a resistance component R1 of the impedance when cell 25 is included (R2≈R1). Moreover, a capacitance component X2 of the impedance when cell 25 is excluded is substantially equal to a capacitance component X1 of the impedance when cell 25 is included (X2≈X1). That is, since difference ΔR2 (=R2−R1) between the resistance components is not more than reference value Rc and difference ΔX2 (=X2−X1) between the capacitance components is not more than reference value Xc, cell 25 is diagnosed as being normal.

When curve L2 is compared with curve L3 in a similar manner, a difference ΔR3 between the resistance components is larger than reference value Rc and a difference ΔX3 between the capacitance components is larger than reference value Xc. Hence, cell 28 is diagnosed as being abnormal.

<Abnormality Diagnosis Process Flow>

Figure 10:
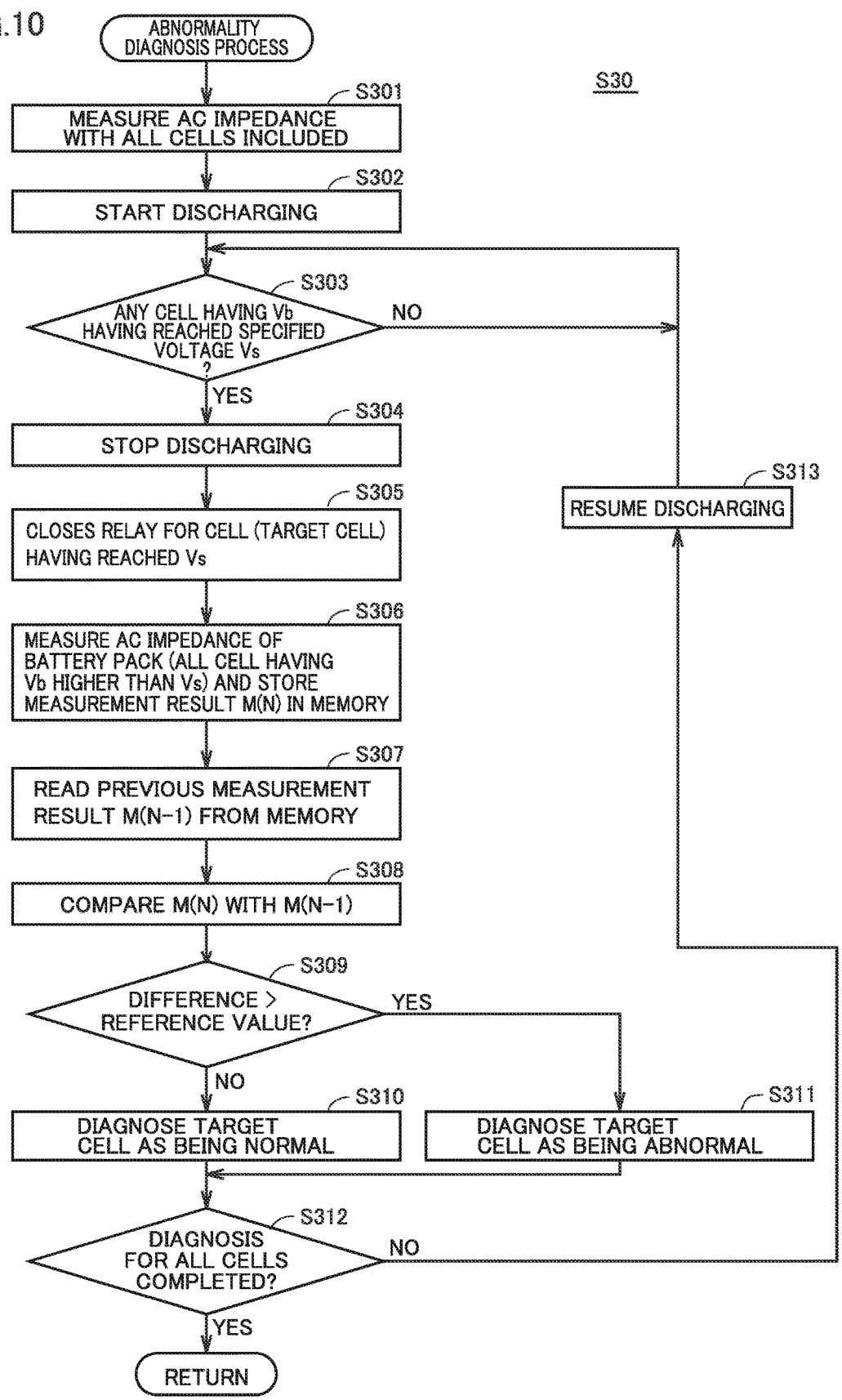
FIG. 10 is a flowchart for illustrating an abnormality diagnosis process shown in FIG. 7 more in detail.

FIG. 10 is a flowchart for illustrating an abnormality diagnosis process (process of S30) shown in FIG. 7 more in detail. It should be noted that although not shown in the figure, when stop switch 320 is pressed by the operator during a cycle, a series of processes are ended even in the middle of the cycle.

In S301, controller 300 measures the AC impedance of battery pack 20 with all the cells 21 to 29 being connected in series, and stores measurement result M(0) in memory 302. Further, in S302, controller 300 controls power converter 17 to start discharging battery pack 20.

Processes of S303 to S313 below are repeatedly performed the same number of times as the number of cells until all the cells are diagnosed. Here, the following describes a case where a process in an N-th cycle (N is a natural number) is performed.

In S303, based on detection values of voltage sensors 141 to 149, controller 300 determines whether or not there is a cell having voltage Vb having reached specified voltage Vs. When there is no cell having voltage Vb having reached specified voltage Vs (NO in S303), battery pack 20 continues to be discharged until voltage Vb of one of the cells reaches specified voltage Vs.

When there is a cell (hereinafter, also referred to as "target cell") that has voltage Vb having reached specified voltage Vs and that is therefore to be diagnosed (YES in S303), controller 300 controls power converter 17 to stop discharging battery pack 20 (S304) (corresponding to "first control" and "first step"). Further, controller 300 closes a relay connected to the target cell in parallel (S305) (corresponding to "second control" and "second step"). Accordingly, in battery pack 20, a plurality of cells each having voltage Vb higher than specified voltage Vs are connected in series and remaining one cell having voltage Vb higher than specified voltage Vs is present.

In S306, controller 300 measures the AC impedance of battery pack 20 and stores a measurement result M(N) in memory 302 (corresponding to "third control" and "third step"). Details of this measurement method have been described in FIG. 4 and will not be described repeatedly.

In 5307, controller 300 reads, from memory 302, a measurement result M(N−1) of AC impedance in a previous ((N−1)-th) cycle. It should be noted that in the first cycle, measurement result M(0) in the process of S301 is read from memory 302.

In S308, controller 300 compares measurement result M(N) (corresponding to "first AC impedance") in the N-th cycle with measurement result M(N−1) (corresponding to "second AC impedance") in the (N−1)-th cycle. More specifically, controller 300 calculates a difference ΔR between the resistance components of the impedances and compares difference ΔR with reference value Rc. Likewise, controller 300 calculates a difference ΔX between the capacitance components of the impedances and compares difference ΔX with reference value Xc.

When difference ΔR between the resistance components is not more than reference value Rc and difference ΔX between the capacitance components is not more than reference value Xc (NO in S309), controller 300 diagnoses the target cell as being normal and stores the diagnosis result in memory 302 (S310). On the other hand, when at least one of (i) a determination result indicating that difference ΔR between the resistance components is larger than reference value Rc and (ii) a determination result indicating that difference ΔX between the capacitance components is larger than reference value Xc is obtained (YES in S309), controller 300 diagnoses the target cell as being abnormal and stores the diagnosis result in memory 302 (S311).

Then, in S312, controller 300 determines whether or not the abnormality diagnosis for all the cells 21 to 29 has been completed. When there is a cell having not been subjected to the abnormality diagnosis (NO in S312), controller 300 resumes to discharge battery pack 20 (S313) (corresponding to "fourth control" and "fourth step"). Accordingly, the series of processes of S303 to S313 are repeated until the abnormality diagnosis for all the cells 21 to 29 is completed. When all the cells 21 to 29 have been diagnosed (YES in S312), controller 300 returns the process to the flowchart of FIG. 7. As a result, the diagnosis results of all the cells 21 to 29 are presented on display 330 (S40).

The operator (for example, dealer) checks the diagnosis results and can report the diagnosis results to the user of the electrically powered vehicle having battery system 1 mounted thereon. For example, when the number of cells diagnosed as being abnormal is more than a predetermined number (or when a ratio of cells diagnosed as being abnormal is more than a predetermined ratio), the operator can propose replacement of battery pack 20 to the user. Moreover, upon the replacement of battery pack 20, normal cells can be removed and reused.

It should be noted that in the flowchart of FIG. 10, it has been described that the abnormality diagnosis (processes of S308 to S311) is performed in each cycle. However, the timing of performing the abnormality diagnosis is not limited to this. For example, the abnormality diagnosis may be performed after measuring the AC impedances of all the cells 21 to 29. Moreover, it has been described that display 330 presents the diagnosis results after completing the abnormality diagnosis for all the cells 21 to 29; however, whenever abnormality diagnosis for each cell is completed, the diagnosis result of the cell may be presented on display 330.

As described above, according to the first embodiment, connection jig 11 is used to achieve a circuit configuration permitting the measurement of the AC impedance based on a battery pack as a unit (with a plurality of cells being connected in series), rather than a cell as a unit. Whenever the voltage of one of the cells reaches specified voltage Vs during the discharging of battery pack 20, the AC impedance is measured with the cell (target cell) being excluded. In other words, the AC impedance measurement is repeated while reducing, one by one, the number of cells connected in series. According to this method, by comparing the measurement result when the target cell is included with the measurement result when the target cell is excluded, whether the target cell is normal or abnormal can be diagnosed. Accordingly, the effort (and time) of reconnecting the AC impedance measuring device from one cell to another cell can be eliminated, thereby reducing the troublesomeness of the abnormality diagnosis for lithium ion secondary batteries and reducing the diagnosis time.

Further, the voltage of an abnormal cell is lower than the voltage of a normal cell in many cases. Hence, according to the first embodiment, a cell having a voltage having reached specified voltage Vs earlier is diagnosed earlier as to whether or not the cell is abnormal. In other words, in the first embodiment, a cell highly likely to be abnormal is diagnosed preferentially as to whether or not the cell is abnormal. Therefore, for example, when the number of cells diagnosed as being abnormal becomes more than a predetermined number even before completion of the abnormality diagnosis for all the cells, it can be determined at an early stage that the whole of battery pack 20 needs to be replaced. Moreover, when battery pack 20 needs to be replaced and normal cells are to be discarded without being reused, the AC impedances of the remaining cells does not need to be measured.

It has been illustrated that a cell is diagnosed as being abnormal when at least one of the first condition and the second condition is satisfied. The first condition is such that the difference between the resistance components is larger than reference value Rc and the second condition is such that the difference between the capacitance components is larger than reference value Xc. However, the cell may be diagnosed as being normal when one of the first and second conditions is satisfied, and the cell may be diagnosed as being abnormal when both of the first and second conditions are satisfied.

[Modification]

In the first embodiment, it has been described that the abnormality diagnosis for battery pack 20 is performed with attention paid to the region (particularly, measurement point Z) at low angular frequency ω in the complex impedance plot; however, attention may be paid to a change in a different region in the complex impedance plot, depending on a type (deterioration state) of deterioration of battery pack 20. For example, by paying attention to the region involving the semicircular locus at high angular frequency ω, the abnormality diagnosis can be performed based on a change in shape of the semicircle.

Figure 11:
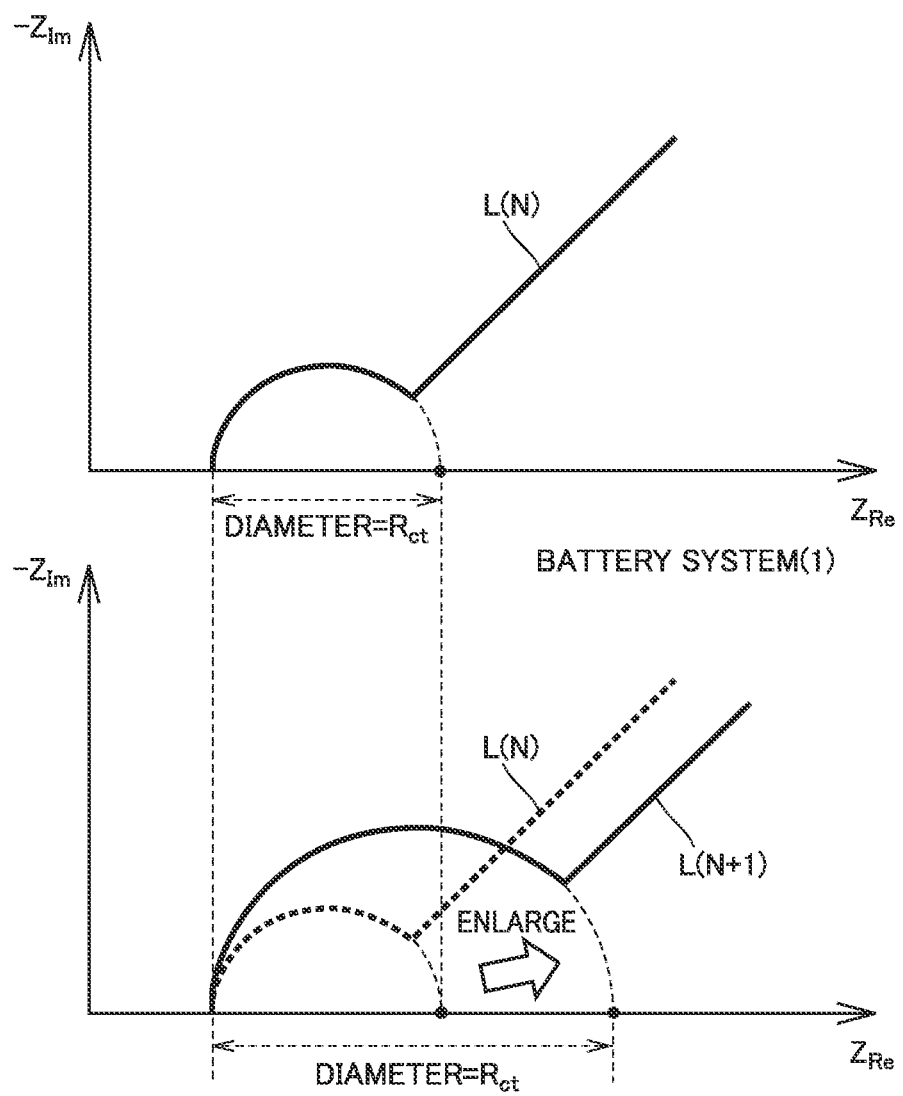
FIG. 11 illustrates abnormality diagnosis based on a semicircular shape in the complex impedance plot.
Figure 12:
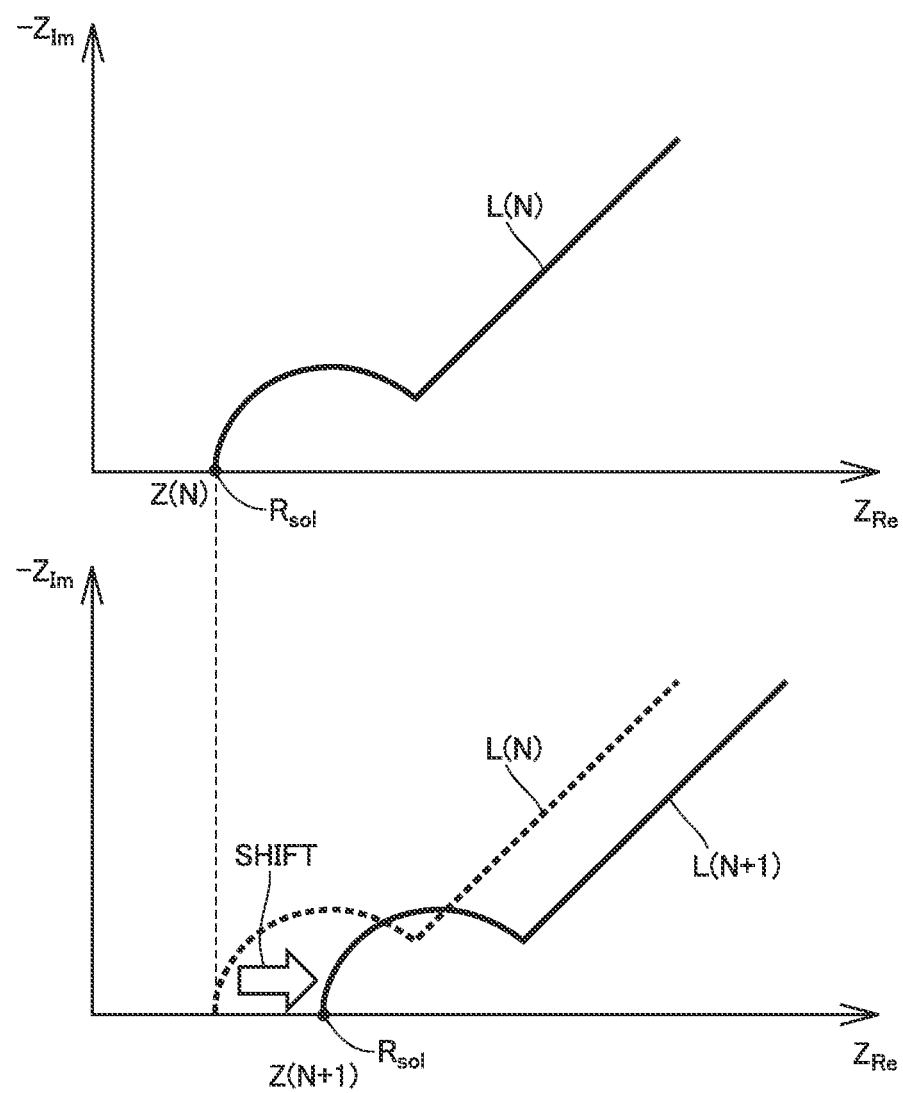
FIG. 12 illustrates another abnormality diagnosis based on the semicircular shape in the complex impedance plot.

FIG. 11 illustrates abnormality diagnosis based on the semicircular shape in the complex impedance plot. FIG. 12 illustrates another abnormality diagnosis based on the semicircular shape in the complex impedance plot. In each of FIG. 11 and FIG. 12, a curve L(N) represents a measurement result when N cells are excluded from the plurality of cells connected in series, and a curve L(N+1) represents a measurement result when (N+1) cells are excluded.

It is indicated that when the diameter (or radius) of the semicircular locus becomes larger as shown in FIG. 11, charge transfer resistance $R_{ct}$ of the target cell corresponding to the difference between curve L(N) and curve L(N+1) is larger than that of a normal cell (see FIG. 6). This means that the electrode performance of the target cell has been decreased. On the other hand, when the semicircular locus is shifted rightward as shown in FIG. 12, it is indicated that solution resistance $R_{sol}$ of the target cell is larger than that of a normal cell (see FIG. 6). This means that the electrolyte solution performance (electrolyte performance) of the target cell has been decreased.

One or both of the abnormality diagnoses described in FIG. 11 and FIG. 12 may be performed instead of or in addition to the abnormality diagnosis described in the first embodiment, i.e., the abnormality diagnosis in the region at low angular frequency ω (see FIG. 8). The flowchart performed in this case is basically the same as the flowchart shown in FIG. 10, and is therefore not described repeatedly in detail.

For comparison between charge transfer resistances $R_{ct}$, for example, a difference is calculated between the diameter of the semicircular locus of curve L(N) and the diameter of the semicircular locus of curve L(N+1) and the difference can be compared with the reference value. Likewise, for comparison between solution resistances $R_{sol}$, a difference is calculated between the real number component at a specific point (for example, Z(N) in FIG. 12) on the locus of curve L(N) and the real number component at a specific point (for example, Z(N+1)) on the semicircular locus of curve L(N+1)), and the difference can be compared with the reference value.

Then, for example, when all of the three types of abnormality diagnoses are performed, controller 300 can diagnose the target cell as being normal when all the differences are not more than the corresponding reference values, and can diagnose the target cell as being abnormal when at least one difference is larger than a corresponding reference value.

[Second Embodiment]

Generally, a lithium ion battery is more deteriorated as charging/discharging is repeated or a period of use becomes longer. This results in a decreased full charge capacity of the lithium ion battery. Therefore, for example, it is desirable for the dealer to perform the abnormality diagnosis and restore (recover) the decreased full charge capacity to a certain extent. In a second embodiment, the following describes a process (hereinafter, also referred to as "recovery process") for recovering the full charge capacity.

By the recovery process in the second embodiment, for example, the full charge capacity decreased due to each of the following three types of deterioration can be recovered. First deterioration is the high-rate deterioration described above. Second deterioration is deterioration due to a so-called memory effect. The memory effect may occur also in the lithium ion secondary battery although it is not notable as in the nickel-metal hydride battery. Specifically, when charging (i.e., charging after partial discharging) is repeated before power stored in the cell is not consumed completely, the discharging voltage of the cell can become lower than that of the cell in the normal condition. Third deterioration is deterioration caused by lithium ions being moved repeatedly between a positive electrode active material layer and a negative electrode active material layer to result in diffusion and accumulation of a part of the lithium ions at a portion at which the positive electrode active material layer does not face the negative electrode active material layer (see Japanese Patent Laying-Open No. 2015-187938).

Figure 13:
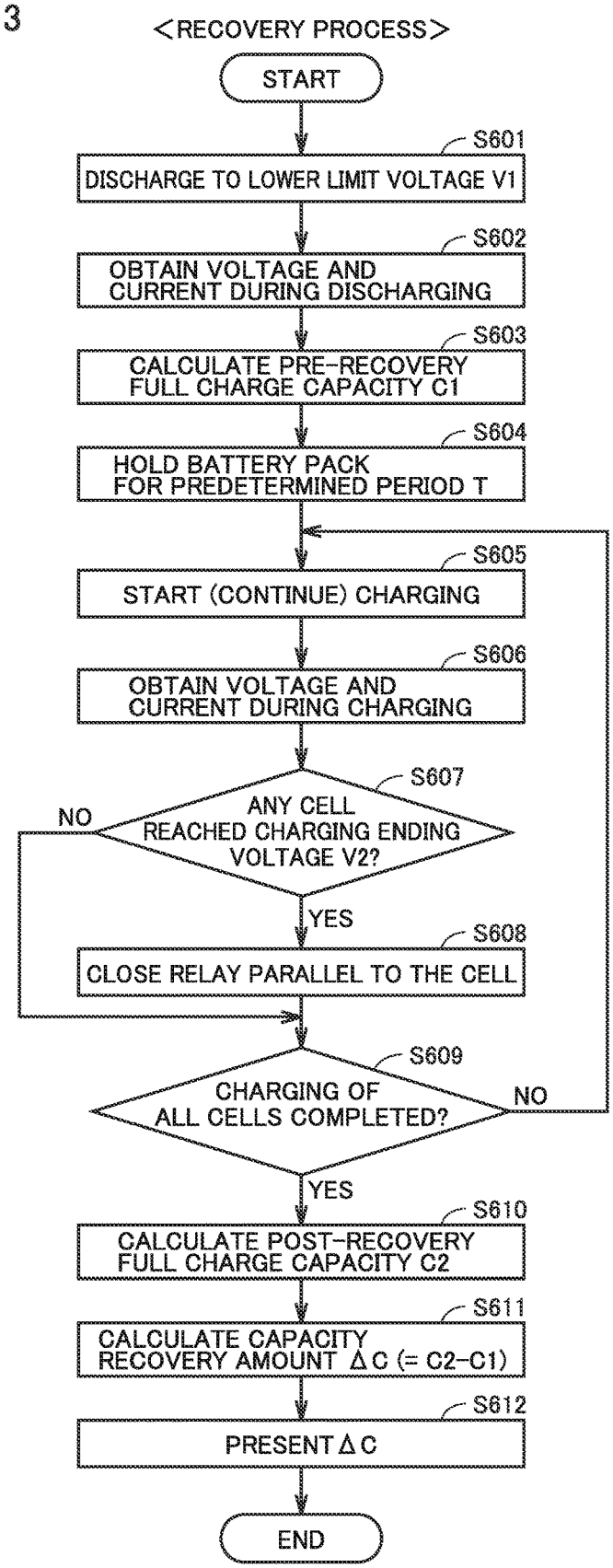
FIG. 13 is a flowchart for illustrating a recovery process in a second embodiment.

FIG. 13 is a flowchart for illustrating the recovery process in the second embodiment. The process shown in this flowchart is performed after performing abnormality diagnosis process S30 (see FIG. 10) of battery pack 20. Upon the start of the recovery process, each of relays 131 to 139 is in the open state.

In S601, controller 300 controls power converter 17 to discharge battery pack 20 until voltages Vb1 to Vb9 of all the cells 21 to 29 reach a lower limit voltage V1. Lower limit voltage V1, which is a voltage with which each of cells 21 to 29 is overdischarged (V1<specified voltage Vs), is appropriately set by an experiment. Generally, since there is a correlation between the voltage (OCV: Open Circuit Voltage) and SOC of the lithium ion secondary battery, lower limit voltage V1 is preferably a voltage with which the SOC of each of cells 21 to 29 is not more than 10%, and lower limit voltage V1 is more preferably a voltage with which the SOC of each of cells 21 to 29 is about 0%.

Controller 300 obtains voltage Vb and current Ib during the discharging of battery pack 20 (S602). Then, based on voltage Vb and current Ib during the discharging, controller 300 calculates a pre-recovery full charge capacity C1 of battery pack 20 (S603). More specifically, controller 300 calculates SOC0 and SOC1 of each cell from voltage Vb, and calculates an integrated value ΣIb of current Ib during the discharging. SOC0 is SOC upon the start of the discharging. SOC1 is SOC upon the end of the discharging (for example, 0%). Then, controller 300 calculates the full charge capacity of each cell using the following formula (4). By adding the full charge capacities of all the cells, pre-recovery full charge capacity C1 of battery pack 20 can be calculated.

$$\text{Full charge capacity} = \{\Sigma Ib/(SOC1-SOC0)\} \times 100 \quad (4)$$

In S604, controller 300 holds battery pack 20 for a predetermined period T with voltage Vb of each cell being maintained at lower limit voltage V1. Predetermined period T is preferably 5 minutes or longer, and is more preferably 1 hour or longer, for example. As predetermined period T is longer, the effect of the recovery process (an amount of recovery of the full charge capacity) becomes larger; however, the effect of the recovery process is hardly increased when predetermined period T becomes long to some extent or becomes longer than that. Therefore, predetermined period T can be set in consideration of the effect of the recovery process, a period of time during which the electrically powered vehicle can be kept from the user, cost for the holding, and the like.

After passage of predetermined period T, controller 300 controls power converter 17 to charge battery pack 20 until each of voltages Vb1 to Vb9 of all the cells 21 to 29 reaches a charging ending voltage V2 (S605). Charging ending voltage V2 is a voltage set in accordance with an SOC range (for example, SOC=40% to 60%) suitable for traveling of the electrically powered vehicle when returning the electrically powered vehicle to the user. Controller 300 obtains voltage Vb and current Ib during the charging of battery pack 20 (S606).

When voltage Vb of a certain cell reaches predetermined charging ending voltage V2 during the charging of battery pack 20 (YES in S607), controller 300 closes a relay connected to the cell in parallel, thereby ending the charging of the cell (S608).

Controller 300 continues the charging of battery pack 20 until each of voltages Vb of all the cells reaches charging ending voltage V2 (NO in S609). When each of voltages Vb of all the cells reaches charging ending voltage V2 (YES in S609), controller 300 assumes that the charging of all the cells has been completed and proceeds the process to S610. In S610, controller 300 calculates a post-recovery full charge capacity C2 of battery pack 20 based on voltage Vb and current Ib during the charging. This calculation is performed in basically the same manner as in the calculation for pre-recovery full charge capacity C1 in S603, and is therefore not described repeatedly in detail.

In S611, controller 300 calculates a recovery amount ΔC of the full charge capacity of battery pack 20. More specifically, controller 300 calculates a difference between post-recovery full charge capacity C2 calculated in S610 and pre-recovery full charge capacity C1 calculated in S603, as capacity recovery amount ΔC (=C2−C1). Then, controller 300 controls display 330 to present capacity recovery amount ΔC (S612).

As described above, according to the second embodiment, the recovery process is performed after performing the abnormality diagnosis for each cell. Thus, the abnormality diagnosis and the recovery process can be performed continuously with connection jig 11 being attached to battery pack 20, whereby the operator (dealer) can provide the recovery of the full charge capacity as a service accompanied with the abnormality diagnosis, for example. Moreover, since the voltage of each cell has been decreased to specified voltage Vs after performing the abnormality diagnosis, the voltage can be decreased to lower limit voltage V1 more quickly than that in the case where the abnormality diagnosis is not performed. Accordingly, time required for the recovery process can be shortened.

It should be noted that the calculations for full charge capacities C1, C2 (processes of S602, S603, S606, and S608 to S610) are not essential if it is intended to only recover the full charge capacity. According to the second embodiment, however, by calculating capacity recovery amount ΔC from pre-recovery full charge capacity C1 and post-recovery full charge capacity C2 of battery pack 20, the operator can quantitatively explain the effect of the recovery process to the user.

Although the embodiments of the present disclosure have been described, the embodiments disclosed herein are illustrative and non-restrictive in any respect. The scope of the present disclosure is defined by the terms of the claims, and is intended to include any modifications within the scope and meaning equivalent to the terms of the claims.

What is claimed is:

1. A lithium ion secondary battery diagnosis device for diagnosing whether or not there is abnormality in a battery pack including lithium ion secondary batteries, the battery pack including an anode, a cathode, and a plurality of cells connected in series between the anode and the cathode, the lithium ion secondary battery diagnosis device comprising:
   a plurality of relays each connected to a corresponding one of the plurality of cells in parallel;
   a power converter electrically connectable to the anode and the cathode, the power converter being configured to discharge the battery pack;
   a measuring instrument electrically connectable to the anode and the cathode, the measuring instrument being configured to measure AC impedance of the battery pack; and
   a controller configured to control the plurality of relays, the power converter, and the measuring instrument,
   the controller being configured to control the power converter to discharge the battery pack,
   whenever a voltage of a cell of the plurality of cells reaches a specified voltage during the discharging, the controller being configured to perform:
      first control to control the power converter to stop discharging the battery pack;
      second control to bypass the cell having the voltage having reached the specified voltage by closing a relay of the plurality of relays, the relay being connected, in parallel, to the cell having the voltage having reached the specified voltage;
      third control to control the measuring instrument to measure the AC impedance of the battery pack in a state in which one or more relays connected, in parallel, to respective corresponding one or more cells having a voltage or voltages having reached the specified voltage are all closed; and
      fourth control to control the power converter to resume discharging remaining one or more cells having a voltage or voltages higher than the specified voltage, after measuring the AC impedance,
   the controller being configured to perform the second control, the third control, and the fourth control after the first control is completed,
   the controller being configured to diagnose whether or not the cell having the voltage having reached the specified voltage is abnormal, by comparing first AC impedance with second AC impedance, the first AC impedance representing AC impedance when the cell having the voltage having reached the specified voltage is included, the second AC impedance representing AC impedance when the cell having the voltage having reached the specified voltage is excluded.

2. The lithium ion secondary battery diagnosis device according to claim 1, wherein
   when neither of first and second conditions is satisfied, the controller is configured to diagnose that the cell having the voltage having reached the specified voltage is normal,
   when at least one of the first and second conditions is satisfied, the controller is configured to diagnose that the cell having the voltage having reached the specified voltage is abnormal,
   the first condition is satisfied when a measurement frequency for AC impedance is lower than a predetermined frequency and a difference between a resistance component of the first AC impedance and a resistance component of the second AC impedance is larger than a first reference value, and the second condition is satisfied when the measurement frequency is lower than the predetermined frequency and a difference between a capacitance component of the first AC impedance and a capacitance component of the second AC impedance is larger than a second reference value.

3. The lithium ion secondary battery diagnosis device according to claim 1, wherein the controller is configured to diagnose that the cell having the voltage having reached the specified voltage is normal, when a difference between a diameter of a semicircle representing the first AC impedance and a diameter of a semicircle representing the second AC impedance is not more than a predetermined reference value in a semicircular locus indicated in a complex impedance plot for AC impedance at a region at which a measurement frequency for AC impedance is higher than a predetermined frequency, and the controller is configured to diagnose that the cell having the voltage having reached the specified voltage is abnormal, when the difference is larger than the reference value.

4. The lithium ion secondary battery diagnosis device according to claim 1, wherein the controller is configured to diagnose that the cell having the voltage having reached the specified voltage is normal, when a measurement frequency for AC impedance is higher than a predetermined frequency and a difference between a resistance component of the first AC impedance and a resistance component of the second AC impedance is not more than a predetermined reference value, and the controller is configured to diagnose that the cell having the voltage having reached the specified voltage is abnormal, when the difference is larger than the reference value.

5. The lithium ion secondary battery diagnosis device according to claim 1, wherein the power converter is further configured to charge the battery pack, the controller is configured to control the power converter to further discharge the battery pack after each of voltages of all the cells reaches the specified voltage, and is configured to control the power converter to charge the battery pack after holding the battery pack for a predetermined period in a state in which each of the plurality of cells has a voltage that is at a lower limit voltage lower than the specified voltage.

6. The lithium ion secondary battery diagnosis device according to claim 1, further comprising a jig configured to be attachable/detachable to/from the battery pack, wherein for each of the plurality of cells, the jig includes a first connection portion and a second connection portion, the first connection portion being configured to electrically connect a positive electrode terminal of the cell to one end of a relay connected to the cell in parallel, the second connection portion being configured to electrically connect a negative electrode terminal of the cell to the other end of the relay.

7. A lithium ion secondary battery diagnosis method for diagnosing whether or not there is abnormality in a battery pack including lithium ion secondary batteries, the battery pack including an anode, a cathode, and a plurality of cells connected in series between the anode and the cathode, each of a plurality of relays being connected to a corresponding one of the plurality of cells in parallel, whenever a voltage of a cell of the plurality of cells reaches a specified voltage during discharging of the battery pack, the lithium ion secondary battery diagnosis method comprising:

stopping discharging the battery pack;

bypassing the cell having the voltage having reached the specified voltage by closing a relay of the plurality of relays, the relay being connected, in parallel, to the cell having the voltage having reached the specified voltage;

measuring AC impedance of the battery pack in a state in which one or more relays connected, in parallel, to respective corresponding one or more cells having a voltage or voltages having reached the specified voltage are all closed;

resuming to discharge remaining one or more cells having a voltage or voltages higher than the specified voltage, after the measuring of the AC impedance of the battery pack; and diagnosing whether or not the cell having the voltage having reached the specified voltage is abnormal, by comparing (i) AC impedance when the cell having the voltage having reached the specified voltage is included with (ii) AC impedance when the cell having the voltage having reached the specified voltage is excluded.

* * * * *